United States Patent [19]

Kondo et al.

[11] 3,933,540
[45] Jan. 20, 1976

[54] METHOD OF MANUFACTURING SEMICONDUCTOR DEVICE

[75] Inventors: Hiroyuki Kondo, Hinode; Atsuo Hotta, Higashiyamato; Akio Hayasaka, Kodaira; Michio Suzuki, Hino, all of Japan

[73] Assignee: Hitachi, Ltd., Japan

[22] Filed: Aug. 8, 1974

[21] Appl. No.: 495,789

[30] Foreign Application Priority Data
Oct. 17, 1973  Japan............................ 48-115821

[52] U.S. Cl. ................... 148/187; 148/175; 357/49
[51] Int. Cl.² ........................................ H01L 21/22
[58] Field of Search ......... 148/175, 187; 357/49, 50

[56] References Cited
UNITED STATES PATENTS

| | | | |
|---|---|---|---|
| 3,648,125 | 3/1972 | Peltzer | 357/50 |
| 3,649,386 | 3/1972 | Murphy | 148/187 |
| 3,659,160 | 4/1972 | Sloan, Jr. et al. | 148/175 X |
| 3,752,711 | 8/1973 | Kooi et al. | 148/187 X |

Primary Examiner—L. Dewayne Rutledge
Assistant Examiner—J. M. Davis
Attorney, Agent, or Firm—Craig & Antonelli

[57] ABSTRACT

A method of manufacturing bipolar transistor elements in a semiconductor integrated circuit isolated by a silicon oxide film, comprises the steps of forming a semiconductor layer of one conductivity type on a semiconductor substrate of the opposite conductivity type, in which each collector region of the one conductivity type is formed, diffusing an impurity of the opposite conductivity type for each base region into the surface of the semiconductor layer of the one conductivity type, performing oxidation down to the surface of the semiconductor substrate by employing an oxidation-resisting film as a mask, to thereby form an isolating silicon oxide film, and diffusing an impurity of the one conductivity type for each emitter region into a selected part of the surface of the diffused semiconductor layer of the opposite conductivity type, whereby the base width of the bipolar transistor elements can be narrowed.

10 Claims, 19 Drawing Figures

METHOD OF MANUFACTURING SEMICONDUCTOR DEVICE

BACKGROUND OF THE INVENTION

1. Field of the Invention

The present invention relates to a method of manufacturing bipolar transistor elements in a semiconductor integrated circuit isolated by a silicon oxide film.

2. Description of the Prior Art

As a method of manufacturing bipolar transistor elements of this type, there has been known the method described in U.S. pat. No. 3,684,125 and illustrated in FIGS. 2a to 2i and discussed hereunder.

As shown in FIG. 2a, on the surface of a semiconductor substrate 1 formed with an $n^+$-type collector region 2, a p-type base layer 10 is epitaxially grown.

Next, as shown in FIG. 2b, the surface of the grown layer 10 is subsequently thinly oxidized, to form an $SiO_2$ film 5.

Further, as shown in FIG. 2c, a silicon nitride ($Si_3N_4$) film 6 is formed thereon.

Then, as shown in FIG. 2d, films 5 and 6 are subjected to selective etching treatments.

Subsequently, as shown in FIG. 2e, one part of the grown layer 10 is removed by etching treatment.

Then, as shown in FIG. 2f, using parts as a mask, the layer 10 is selectively oxidized down to the surface portion of the semiconductor substrate 1, to form an $SiO_2$ film 7.

Thereafter, as shown in FIG. 2g, a high impurity concentration region 2a for collector ohmic contact is formed.

Then, as shown in FIG. 2h, in order to increase the impurity concentration of the base region to a prescribed value, a p-type impurity is added into the surface of the base region, to thereby form a $p^+$-type semiconductor layer 10'.

Finally, as shown in FIG. 2i, selective diffusion of emitter region 9 is carried out.

With this method, the p-type epitaxial layer 10 is thick, so that unless the diffusion depth of the emitter 9 is made large to some extent, the effective base width cannot be made small. Also, control thereof, is difficult. For these reasons, the prior-art method has been unsuitable for the manufacture of transistor elements for high speed or high frequency use.

In order to produce a transistor element of small base width or having a shallow base, it has been proposed to form an n-type epitaxially-grown layer on the semiconductor substrate with collector diffused therein, to effect isolation oxidation and, thereafter, to diffuse the base into the surface of the n-type epitaxially-grown layer.

According to this method, however, the silicon oxide film 7 for isolation is so formed that it is thick at its peripheral part as illustrated in detail in FIG. 3a. Since the diffusion of a $p^+$-type impurity layer 4 for forming the base region is effected by employing the $SiO_2$ film 7 as a mask, the $p^+$-type diffusion depth at the peripheral part becomes small. As a result, the end part of the collector 3 - base 4 junction Jc extends beneath a shallow part of the $SiO_2$ film 7, to bring about a state in which a base electrode 11 and the collector region of the n-type epitaxially-grown layer 3 are prone to be short-circuited. Therefore, the method hitherto attempted has had the problem that the yield is very low.

SUMMARY OF THE INVENTION

An object of the present invention is to narrow the base width of a bipolar transistor in a semiconductor integrated circuit of the oxide film isolation system.

Another object is to prevent short-circuits between a base electrode and a collector region in the transistor element portion.

Still another object is to accomplish both the above-mentioned objects without uselessly increasing the number of manufacturing steps.

The fundamental construction of the present invention for accomplishing these objects is characterized by forming a semiconductor layer of a first conductivity type on a semiconductor substrate of a second conductivity type in which a collector region of the first conductivity type is formed, diffusing an impurity of the second conductivity type for a base region into the surface of the semiconductor layer of the first conductivity type, effecting oxidation down to a surface portion of the semiconductor substrate of the second conductivity type by employing an oxidation-resisting film, as a mask, thereby to form a silicon oxide film for isolating elements from one another and, thereafter, selectively diffusing an impurity of the first conductivity type for an emitter region into the surface of the diffused semiconductor layer of the second conductivity type.

PREFERRED EMBODIMENT OF THE INVENTION

FIGS. 1a to 1h illustrate an embodiment of the present invention in the order of manufacturing steps. Description will now be made with reference to these figures.

Figure 1A:
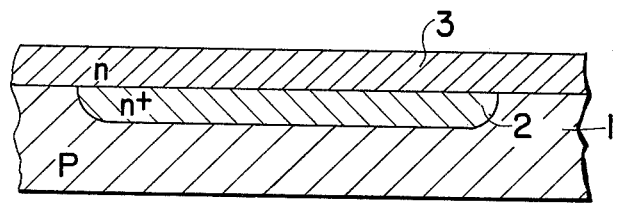
FIGS. 1a to 1h are sectional views showing an embodiment of the present invention in the order of manufacturing steps.

As is shown in FIG. 1a, a p-type semiconductor substrate 1 formed in its surface with an $n^+$-type diffused collector region 2, an n-type semiconductor layer 3 is epitaxially grown (thickness $1:2\mu$).

Figure 1B:
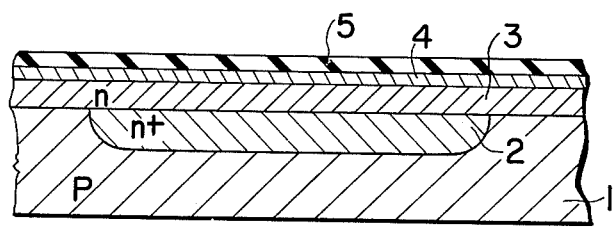

Then, as shown in FIG. 1b, on the surface of the n-type semiconductor layer 3, boron is deposited at a temperature of 875° C for 40 minutes. In this case, boron deposition layer 4 becomes $0.13\mu$ in thickness, having a sheet resistance of 160 $\Omega/\square$ and a surface impurity concentration of $1 \times 10^{20}$ cm$^{-3}$.

Immediately, thereafter, the resultant substrate is subjected to an oxidation treatment at a temperature of 800° C in a water vapor atmosphere of 95° C, for 120 minutes. Due to this treatment, the thickness of the boron deposition layer 4 hardly changes, the surface impurity concentration is lowered by one order, and an $SiO_2$ film (900 A thick) 5 is formed on the semiconductor surface.

When an $Si_3N_4$ film to be used as a mask for selective oxidation is formed directly on the silicon substrate to a thickness of 0.2 to 0.5 $\mu$, defects arise in the silicon crystal. The $SiO_2$ film 5 is therefore necessary as an intervening member between the substrate and the Si₃N₄ film.

Figure 1C:
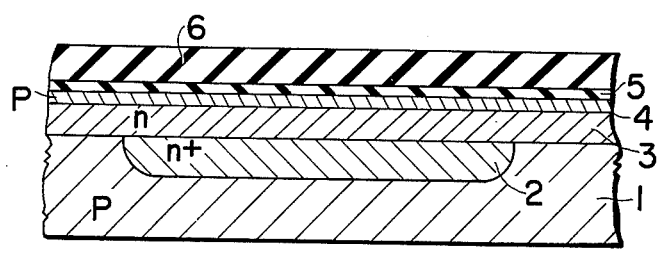

Next, as shown in FIG. 1c, an Si₃N₄ film 6 is formed on the SiO₂ film 5.

Figure 1D:
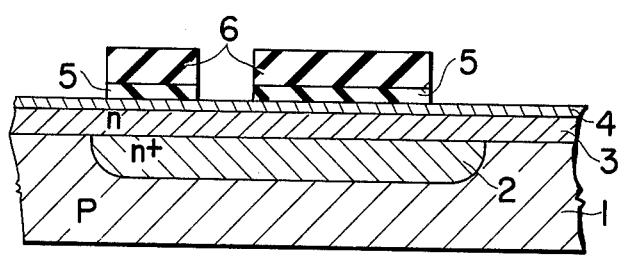

Then, as shown in FIG. 1d, portions of the Si₃N₄ film 6 are selectively removed along with portions of the SiO₂ film 5, by photoetching.

Figure 1E:
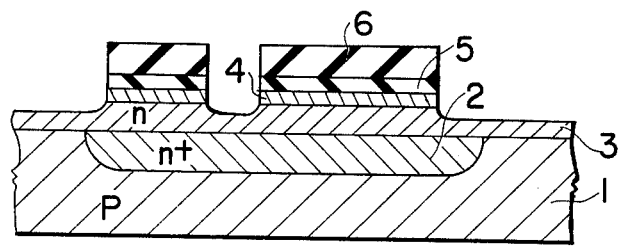

As is shown in FIG. 1e, using the Si₃N₄ film 6 as a mask, the surface of the semiconductor substrate is removed to a depth of about 0.5 to 1μ by etching. The etching treatment is carried out in order to previously compensate the expansion of the substrate surface portion due to the subsequent, selective oxidation treatment of the substrate surface.

Figure 1F:
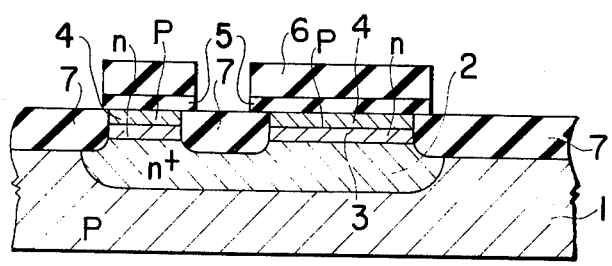

Next, as shown in FIG. 1f, employing the Si₃N₄ film 6 as a mask, oxidation is carried out down to the surface portion of the semiconductor substrate 1, to form an SiO₂ film 7 for isolation (1.5–1.9 μ thick).

Such an oxidation treatment is carried out at a temperature of 1,000 °C in a water vapor atmosphere of 95°C for 14–16 hours. At that time, the diffused layer 4 for forming a base region becomes 0.6 – 0.8 μ in thickness and has a sheet resistance of 550 Ω/ , and the impurity is not deeply diffused into the collector region.

Figure 1G:
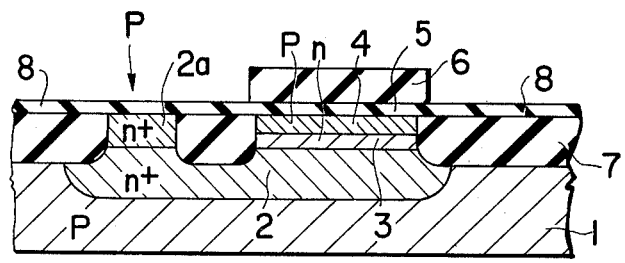

Then, as shown in FIG. 1g, the Si₃N₄ film 6, having been used as the mask for the selective oxidation, is removed only at the selected part which corresponds to a collector electrode to be subsequently formed. Thereafter, an n-type impurity is doped to form a high concentration region 2a for ohmic contact and simultaneously therewith an SiO₂ film 8 is thermally grown.

Figure 1H:
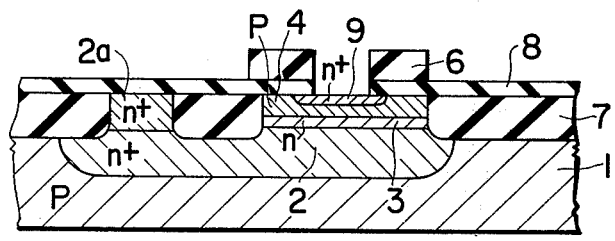

Finally, as shown in FIG. 1h, the Si₃N₄ film 6 is photoetched, and an n-type impurity is doped into a selected area of the surface of the base region 4, to form an emitter region 9 to a depth of 0.4–0.6μ.

Figure 3A:
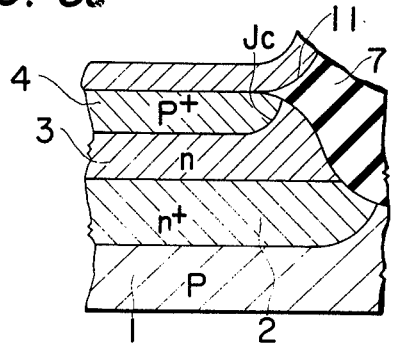
FIGS. 3a and 3b are sectional views for comparing the states of base portions in the case of the present invention (FIG. 3 b) and in the case of a method of the prior art (FIG. 3a).
Figure 3B:
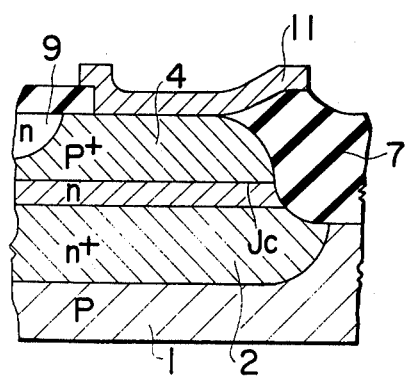

According to such a method, the base region is not formed by the diffusion treatment after the selective oxidation of the semiconductor substrate for isolating the elements from one another, but it is so formed that the p-type impurity existent in the surface of the n-type semiconductor layer 3 formed by epitaxial growth beforehand is diffused by the heating treatment at the selective oxidation. As is shown in FIG. 3b, therefore, the collector - base junction Jc is not exposed at the surface of the semiconductor substrate (or does not extend to a shallow part of the semiconductor substrate) and is formed at a deep part within the semiconductor substrate. Thus, a short-circuit between the collector region 2 and a base electrode 11 can be prevented.

Consequently, transistor elements having a shallow base can be easily formed, and the high speed properties and high frequency characteristics of the semiconductor integrated circuit employing the oxide film isolation system are afforded.

Figure 2A:
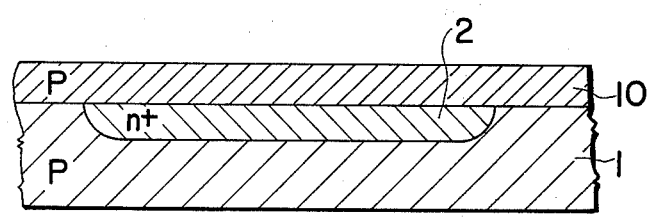
FIGS. 2a to 2i are sectional views showing a prior-art method in the order of manufacturing steps.
Figure 2B:
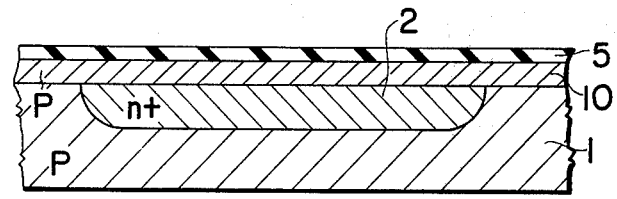
Figure 2C:
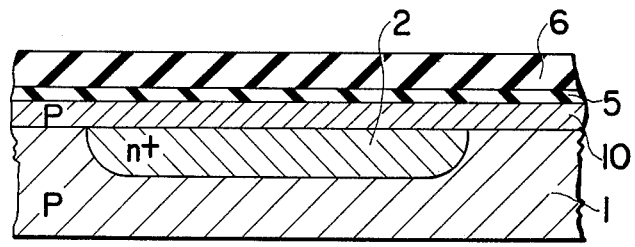
Figure 2D:
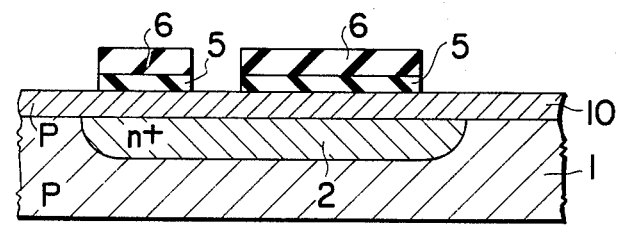
Figure 2E:
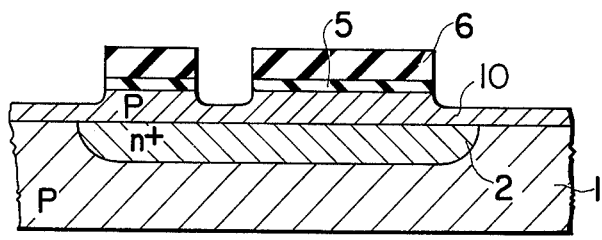
Figure 2F:
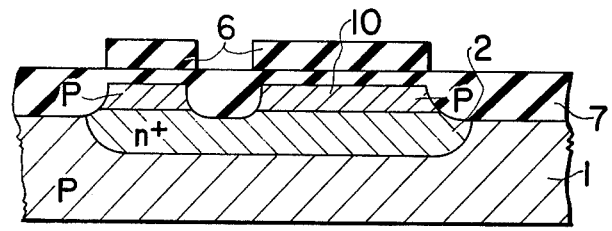
Figure 2G:
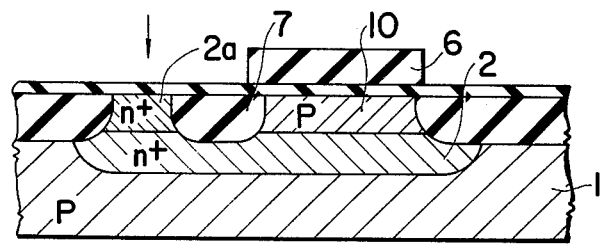
Figure 2H:
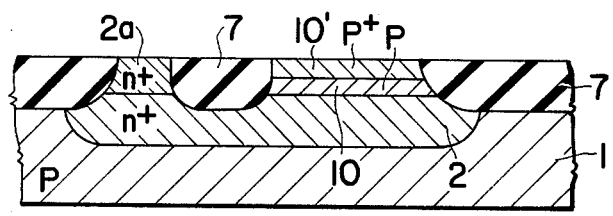
Figure 2I:
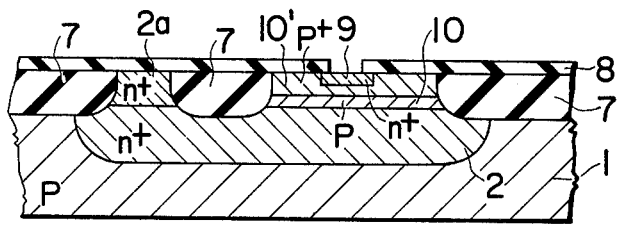

With the prior-art method as shown in FIGS. 2a to 2i, a special step is required in order to form the SiO₂ film 5 between the Si₃N₄ film 6 and the semiconductor substrate (refer to FIG. 2b). Further, prior to the selective diffusion of the base region, an SiO₂ film and the Si₃N₄ film formed on the substrate surface must be completely removed (refer to FIG. 2h).

In contrast, according to the present invention, the SiO₂ film 5 to be interposed between the Si₃N₄ film 6 and the semiconductor substrate can be formed simultaneously with the impurity diffusion treatment for the semiconductor layer 3, and no special step is necessary (refer to FIG. 1b). Moreover, as the mask for the selective diffusion of the emitter region, the Si₃N₄ film having been used during the selective oxidation can be employed by merely etching it selectively. Thus, the manufacturing process is simplified.

It is also possible for any impurity to be diffused into the base region surface at a step immediately before performing the emitter diffusion, to thereby attain a higher operating speed.

While we have shown and described several embodiments in accordance with the present invention, it is understood that the same is not limited thereto but is susceptible of numerous changes and modifications as known to a person skilled in the art, and We therefore do not wish to be limited to the details shown and described herein but intend to cover all such changes and modifications as are obvious to one of ordinary skill in the art.

What is claimed is:

1. A method of manufacturing a semiconductor device comprising the steps of:
   a. forming a first semiconductor region of a first conductivity type into a first surface portion of a semiconductor substrate of a second conductivity type, opposite said first conductivity type;
   b. forming a first semiconductor layer having said first conductivity type on said substrate and said first region formed therein;
   c. introducing a first impurity of said second conductivity type to a prescribed depth into the surface of said first semiconductor layer, thereby forming a second semiconductor region of said second conductivity type in said first semiconductor layer;
   d. selectively oxidizing prescribed portions of said first semiconductor layer down through said layer and reaching said substrate and said first semiconductor region, thereby forming an oxide film for isolating elements from one another; and
   e. introducing a second impurity of said first conductivity type into a selected surface portion of said second semiconductor region.

2. A method according to claim 1, wherein step (d) further includes the step of further diffusing said first impurity into said first semiconductor layer during the oxidation of said substrate so that the resultant depth of said second semiconductor region increases to a depth greater than said prescribed depth.

3. A method according to claim 1, wherein step (d) includes the steps of:
   d1. selectively forming a first masking layer on the surface of said second semiconductor region;
   d2. removing the exposed portions of said second semiconductor region and a surface part of said first semiconductor layer therebeneath not masked by said first masking layer; and
   d3. oxidizing the exposed portion of said first semiconductor layer so that the resultant oxide film reaches said substrate.

4. A method according to claim 3, wherein step (d) further includes the step of (d4) further diffusing said first impurity into said first semiconductor layer during the oxidation of said substrate so that the resultant depth of said second semiconductor region, increases to a depth greater than said prescribed depth.

5. A method according to claim 4, wherein the resultant depth of said second semiconductor region is less than the thickness of said resultant oxide film.

6. A method according to claim 2, wherein the interface of said second semiconductor region and said first semiconductor layer defines a PN junction spaced apart from the interface of said first semiconductor region and said first semiconductor layer by said first semiconductor layer therebetween.

7. A method according to claim 3, wherein step (e) comprises the steps of:
- e1. introducing a second impurity of said first conductivity type into a first selected portion of said second semiconductor region to reach said first semiconductor region; and
- e2. introducing said second impurity into a second selected portion of said second semiconductor region, spaced apart from said first selected portion thereof by said oxide film therebetween, to a depth less than that to which said second impurity is introduced in said first selected portion, whereby said second semiconductor region is contiguous to said first semiconductor region at said first selected portion, but is spaced apart therefrom by said first semiconductor layer therebetween at said second selected portion.

8. A method according to claim 7, wherein step (d) further includes the step of (d4) further diffusing said first impurity into said first semiconductor layer during the oxidation of said substrate so that the resultant depth of said second semiconductor region, increases to a depth greater than said prescribed depth.

9. A method according to claim 3, wherein step (d1) comprises the steps of:
- dli. selectively forming a layer of silicon dioxide on said second semiconductor region; and
- dlii. forming a layer of silicon nitride on said layer of silicon dioxide.

10. A method according to claim 9, wherein said substrate is a silicon substrate, said oxide film being a silicon dioxide film.

* * * * *